US012336315B2

(12) United States Patent
Cho et al.

(10) Patent No.: US 12,336,315 B2
(45) Date of Patent: Jun. 17, 2025

(54) STACKED IMAGE SENSORS

(71) Applicant: Samsung Electronics Co., Ltd., Suwon-si (KR)

(72) Inventors: Dongseok Cho, Suwon-si (KR); Jongeun Park, Suwon-si (KR); Jeongsoon Kang, Suwon-si (KR); Gyunha Park, Suwon-si (KR); Gwideok Ryan Lee, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 135 days.

(21) Appl. No.: 18/482,923

(22) Filed: Oct. 9, 2023

(65) Prior Publication Data
US 2024/0038792 A1   Feb. 1, 2024

(30) Foreign Application Priority Data
Oct. 28, 2022   (KR) .................. 10-2022-0141616

(51) Int. Cl.
*H10F 39/00* (2025.01)
*H04N 25/77* (2023.01)
*H04N 25/78* (2023.01)
*H04N 25/79* (2023.01)
*H10F 39/18* (2025.01)

(52) U.S. Cl.
CPC ......... *H10F 39/8033* (2025.01); *H04N 25/77* (2023.01); *H04N 25/78* (2023.01); *H04N 25/79* (2023.01); *H10F 39/182* (2025.01)

(58) Field of Classification Search
CPC .. H10F 39/8033; H10F 39/182; H10F 39/809; H04N 25/77; H04N 25/78; H04N 25/79
See application file for complete search history.

(56) References Cited

U.S. PATENT DOCUMENTS

| 7,622,699 B2 * | 11/2009 | Sakakibara | H04N 25/771 |
| | | | 250/214 R |
| 10,438,989 B2 | 10/2019 | Kim et al. | |
| 11,289,526 B2 | 3/2022 | Shohji et al. | |
| 11,329,077 B2 | 5/2022 | Hagimoto | |
| 11,336,860 B2 | 5/2022 | Yonemoto | |

(Continued)

FOREIGN PATENT DOCUMENTS

WO   2020262501 A1   12/2020

*Primary Examiner* — Nicholas G Giles
(74) *Attorney, Agent, or Firm* — Myers Bigel, P.A.

(57) ABSTRACT

The stacked image sensor includes a first semiconductor substrate and including a photoelectric conversion region and a floating diffusion area, a first insulating layer under the first semiconductor substrate and including a gate of a transfer transistor, a second semiconductor substrate under the first insulating layer and including first impurities of a first conductivity type, and a second insulating layer under the second semiconductor substrate and including a metal pad of a floating diffusion node and a gate of a source follower transistor, wherein the floating diffusion area and the metal pad of the floating diffusion node are electrically connected through a deep contact that is in the first insulating layer and the second semiconductor substrate. The second semiconductor substrate further includes a well region. At least a portion of deep contact may be in the well region. The well region may surround the deep contact.

20 Claims, 11 Drawing Sheets

(56) References Cited

U.S. PATENT DOCUMENTS

| | | | |
|---|---|---|---|
| 2008/0258047 A1* | 10/2008 | Sakakibara | G01J 1/44 |
| | | | 250/214 C |
| 2008/0259178 A1* | 10/2008 | Oike | H04N 25/63 |
| | | | 348/222.1 |
| 2022/0021826 A1 | 1/2022 | Ejiri | |
| 2022/0181364 A1 | 6/2022 | Miyake et al. | |

* cited by examiner

STACKED IMAGE SENSORS

CROSS-REFERENCE TO RELATED APPLICATION

This application is based on and claims priority under 35 U.S.C. § 119 to Korean Patent Application No. 10-2022-0141616, filed on Oct. 28, 2022, in the Korean Intellectual Property Office, the disclosure of which is incorporated by reference herein in its entirety.

BACKGROUND

The inventive concept relates to an image sensor and, more particularly, to a stacked complementary metal-oxide-semiconductor (CMOS) image sensor.

A CMOS image sensor (CIS) may include a pixel area and a logic area. A plurality of pixels are arranged in a two-dimensionally in the pixel area, and a unit pixel of the pixels may include one photodiode and pixel transistors. The pixel transistors may include, for example, a transfer transistor, a reset transistor, a source follower transistor, and a selection transistor. Logic elements for processing pixel signals from the pixel area may be disposed in the logic area. Recently, a CIS having a structure in which a pixel area and a logic area are formed on separate chips and two or more chips are stacked has developed. The stacked CIS may contribute to obtaining high-definition through maximization of the number of pixels in the pixel area and optimization of the performance of logic elements in the logic area.

SUMMARY

The inventive concept provides a stacked image sensor having a high conversion gain.

According to an aspect of the inventive concept, there is provided a stacked image sensor.

The stacked image sensor includes a first semiconductor substrate including a photoelectric conversion region and a floating diffusion area configured to store charges transferred from the photoelectric conversion region, wherein a color filter and a micro lens are disposed on the first semiconductor substrate, a first insulating layer under the first semiconductor substrate and including a gate of a transfer transistor configured to transfer charges from the photoelectric conversion region, a second semiconductor substrate under the first insulating layer and including first impurities of a first conductivity type, and a second insulating layer under the second semiconductor substrate and including a metal pad of a floating diffusion node and a gate of a source follower transistor, wherein the floating diffusion area and the metal pad of the floating diffusion node are electrically connected through a deep contact that is in (e.g., penetrates) the first insulating layer and the second semiconductor substrate, wherein the second semiconductor substrate further includes a well region. At least a portion of deep contact may be in the well region. In some embodiments, the well region may surround the deep contact.

According to another aspect of the inventive concept, there is provided a stacked image sensor.

The stacked image sensor includes a first semiconductor chip in which a plurality of pixels are disposed in an upper region of the first semiconductor chip in a two-dimensional array structure and a first insulating layer is in a lower region of the first semiconductor chip, a second semiconductor chip including at least one transistor configured to output a pixel signal of the plurality of pixels and a second insulating layer in a lower region of the second semiconductor chip, and a third semiconductor chip including a circuit configured to process the pixel signal, wherein the first semiconductor chip and the second semiconductor chip are electrically connected to each other through a deep contact extending in a vertical direction. The second semiconductor chip may include a well region that includes first impurities and is electrically connected to a source region of the at least one transistor. At least a portion of the deep contact may be in the well region. In some embodiments, the well region may surround the deep contact.

According to an aspect of the inventive concept, there is provided a stacked image sensor.

The stacked image sensor includes a pixel array in which a plurality of pixels are arranged, a row driver configured to transmit a boosting signal to the pixel array, and a readout circuit configured to read out pixel signals output from pixels of a row line selected by the row driver, wherein each of the plurality of pixels includes a photodiode, a transfer transistor electrically connected to the photodiode, a floating diffusion node configured to accumulate/store charges generated by the photodiode, a deep contact capacitor connected to an output terminal of the transfer transistor, and a source follower transistor including one end electrically connected to a pixel voltage, a gate electrically connected to the floating diffusion node, and a source electrically connected to the deep contact capacitor.

BRIEF DESCRIPTION OF THE DRAWINGS

Example embodiments of the inventive concept will be more clearly understood from the following detailed description taken in conjunction with the accompanying drawings in which.

DETAILED DESCRIPTION

Hereinafter, various example embodiments of the inventive concept will be described with reference to the accompanying drawings.

Figure 1:
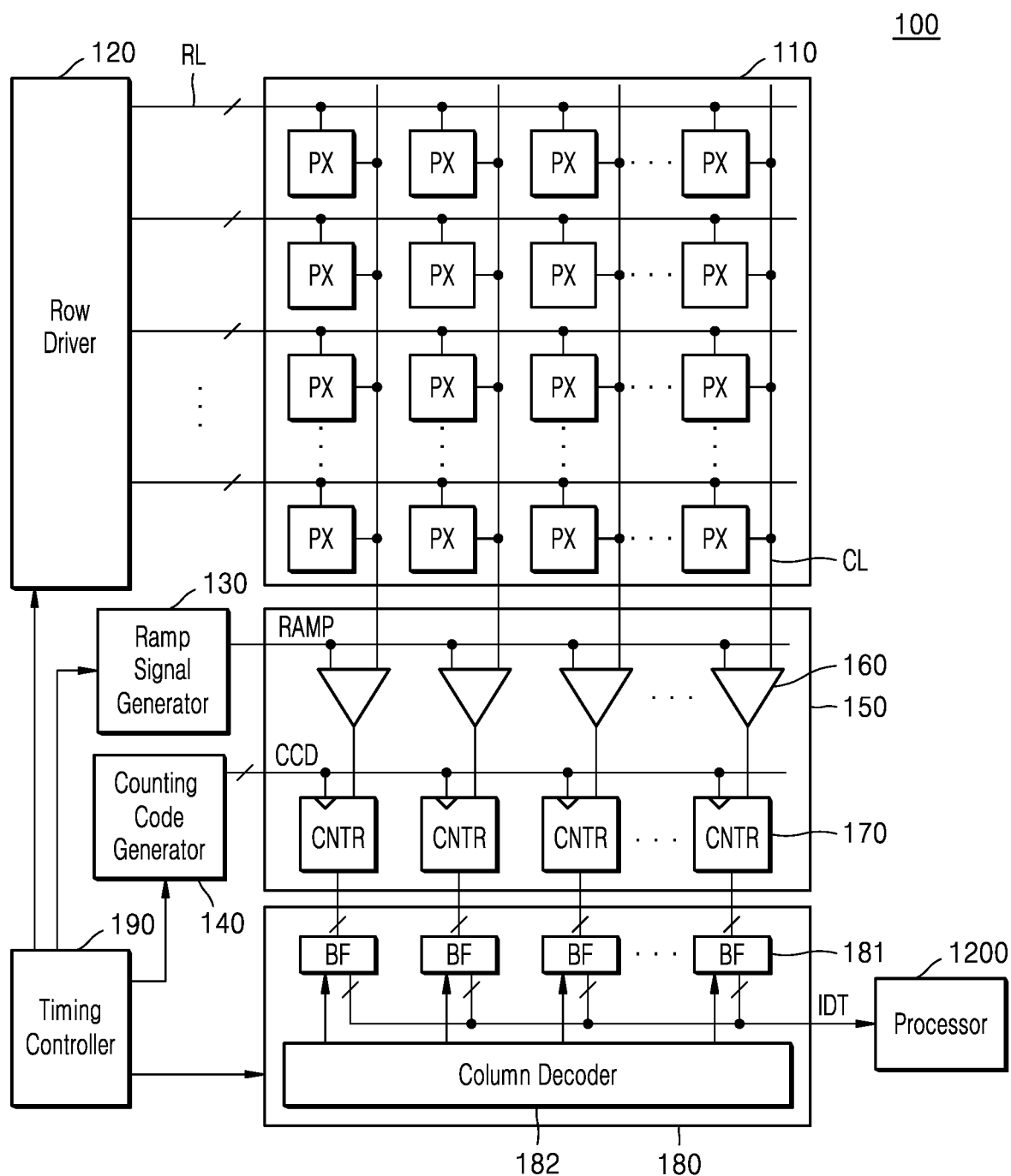
FIG. 1 is a block diagram of a stacked image sensor according to some embodiments of the inventive concept.

FIG. 1 is a block diagram of an image sensor according to some embodiments of the inventive concept.

Referring to FIG. 1, an image sensor 100 may include a pixel array 110, a row driver 120, a ramp signal generator 130, a counting code generator 140, an analog-to-digital conversion circuit 150 (hereinafter referred to as an ADC circuit), a data output circuit 180, and a timing controller 190. A configuration including the ADC circuit 150 and the data output circuit 180 may be referred to as a readout circuit.

The pixel array 110 may include a plurality of row lines RL, a plurality of column lines CL, and a plurality of pixels PX. The plurality of pixels PX are connected to a plurality of row lines RL and a plurality of column lines CL and may be arranged in a matrix. The plurality of pixels PX may be an active pixel sensor (APS).

Each of the plurality of pixels PX may include at least one photoelectric conversion element, and the pixel PX may sense light using a photoelectric conversion element and may output an image signal that is an electrical signal according to the sensed light. For example, the photoelectric conversion element may include a photodiode, a phototransistor, a photogate, or a pinned photodiode. In this specification, the photoelectric conversion element will be described assuming that it is a photodiode.

Meanwhile, a micro lens for light collection may be disposed on the upper portion of each pixel PX or on each of pixel groups including adjacent pixels PX. Each of the plurality of pixels PX may detect light in a certain spectral region from light received through the micro lens. For example, the pixel array 110 may include a red pixel for converting light in the red spectral region into electrical signals, a green pixel for converting light in the green spectral region into an electrical signal, and a blue pixel for converting light in the blue spectral region into an electrical signal.

A color filter for transmitting light in a certain spectral region may be disposed above each of the plurality of pixels PX. However, the inventive concept is not limited thereto, and the pixel array 110 may include pixels that convert light in a spectral region other than red, green, and blue into electrical signals.

In some embodiments, the pixel PX may have a multi-layer structure. The multi-layered pixel PX includes a plurality of stacked photoelectric conversion elements that convert light in different spectral regions into electrical signals, and electrical signals corresponding to different colors may be generated from a plurality of photoelectric conversion elements. In other words, electrical signals corresponding to a plurality of colors may be output from one pixel PX.

In each pixel PX, charges generated by photoelectric conversion elements such as photodiodes may accumulate and/or store in the floating diffusion node, and the charge accumulated/stored in the floating diffusion node may be converted into a voltage. In this case, a rate at which charges accumulated/stored in the floating diffusion node are converted into voltage may be referred to as a conversion gain. The conversion gain may be varied according to the capacitance of the floating diffusion node.

The image sensor 100 according to some embodiments of the inventive concept may be a stacked image sensor. The image sensor 100 according to some embodiments of the inventive concept may be provided as a stacked image sensor and may include a deep contact DCC electrically connecting components to each other included in different layers. In some embodiments, a deep contact-based capacitor may be connected to a floating diffusion node. The image sensor 100 according to some embodiments of the inventive concept may reduce the capacitance of the floating diffusion node by reducing the capacitance of the deep contact, and accordingly, a structure capable of increasing a conversion gain is disclosed. A detailed description of this will be described later.

The row driver 120 drives the pixel array 110 in units of rows. The row driver 120 may decode a row control signal (e.g., an address signal) received from the timing controller 190 and may select at least one row line from among row lines constituting the pixel array 110 in response to the decoded row control signal. For example, the row driver 120 may generate a selection signal for selecting one of a plurality of rows. Also, the pixel array 110 may output a pixel signal, for example, a pixel voltage, from a row selected by a selection signal provided from the row driver 120. The pixel signal may include a reset signal and an image signal. The row driver 120 may transmit control signals for outputting a pixel signal to the pixel array 110, and the pixel PX may output a pixel signal by operating in response to the control signals.

The ramp signal generator 130 may generate a ramp signal (e.g., a ramp voltage) whose level rises or falls with a preset slope under the control of the timing controller 190. The ramp signal RAMP may be provided to the plurality of CDS circuits 160 included in the ADC circuit 150, respectively.

The counting code generator 140 may generate a counting code CCD under the control of the timing controller 190. The counting code CCD may be provided to each of the plurality of counter circuits 170. In some embodiments, the counting code generator 140 may be implemented as a gray code generator. The counting code generator 140 may generate a plurality of code values having a resolution according to the set number of bits as a counting code CCD. For example, when a 10-bit code is set, the counting code generator 140 may generate a counting code CCD including 1024 code values that sequentially increase or decrease.

The ADC circuit 150 may include a plurality of correlated double sampling (CDS) circuits 160 and a plurality of counter circuits 170. The ADC circuit 150 may convert a pixel signal (e.g., pixel voltage) input from the pixel array 110 into a pixel value that is a digital signal. Each pixel signal received through each of the plurality of column lines CL may be converted into a pixel value that is a digital signal by the CDS circuit 160 and the counter circuit 170.

The CDS circuit 160 may compare a pixel signal, for example, a pixel voltage, received through the column line CL with the ramp signal RAMP, and output the comparison result as a comparison result signal. When the level of the ramp signal RAMP and the level of the pixel signal are the same, the CDS circuit 160 may output a comparison signal that transitions from a first level (e.g., logic high) to a second level (e.g., logic low). The time point at which the level of the comparison signal transitions may be determined according to the level of the pixel signal.

The CDS circuit 160 may sample a pixel signal provided from the pixel PX according to a Correlated Double Sampling (CDS) method. The CDS circuit 160 may sample a reset signal received as a pixel signal and compare the reset signal with the ramp signal RAMP to generate a comparison signal according to the reset signal. Afterwards, the CDS circuit may sample an image signal correlated with the reset signal and compare the image signal with the ramp signal RAMP to generate a comparison signal according to the image signal.

The counter circuit 170 may count a level transition point of the comparison result signal output from the CDS circuit 160 and output a count value. In some embodiments, the counter circuit 170 may include a latch circuit and an arithmetic circuit. The latch circuit may receive the counting code CCD from the counting code generator 140 and the comparison signal from the CDS circuit 160 and latch the code value of the counting code CCD when the level of the comparison signal transitions. The latch circuit may latch each of a code value corresponding to a reset signal, for example, a reset value, and a code value corresponding to an image signal, for example, an image signal value. The arithmetic circuit may generate an image signal value from which the reset level of the pixel PX is removed by calculating the reset value and the image signal value. The counter circuit 170 may output the image signal value from which the reset level is removed as a pixel value.

The data output circuit 180 may temporarily store the pixel values output from the ADC circuit 150 and then output the pixel values. The data output circuit 180 may include a plurality of column memories 181 and a column decoder 182. The column memory 181 stores pixel values received from the counter circuit 170. In some embodiments, each of the plurality of column memories 181 may be included in the counter circuit 170. The plurality of pixel values stored in the plurality of column memory 181 may be output as image data IDT under the control of the column decoder 182.

The timing controller 190 outputs a control signal to each of the row driver 120, the ramp signal generator 130, the counting code generator 140, the ADC circuit 150, and the data output circuit 180, so that operations or timing of the row driver 120, the ramp signal generator 130, the counting code generator 140, the ADC circuit 150, and the data output circuit 180 may be controlled.

The processor 1200 connected to the image sensor 100 may perform noise reduction processing, gain adjustment, waveform shaping processing, interpolation processing, white balance processing, gamma processing, edge enhancement processing, and binning on image data. In some embodiments, the processor 1200 may be included inside the image sensor 100.

Figure 2:
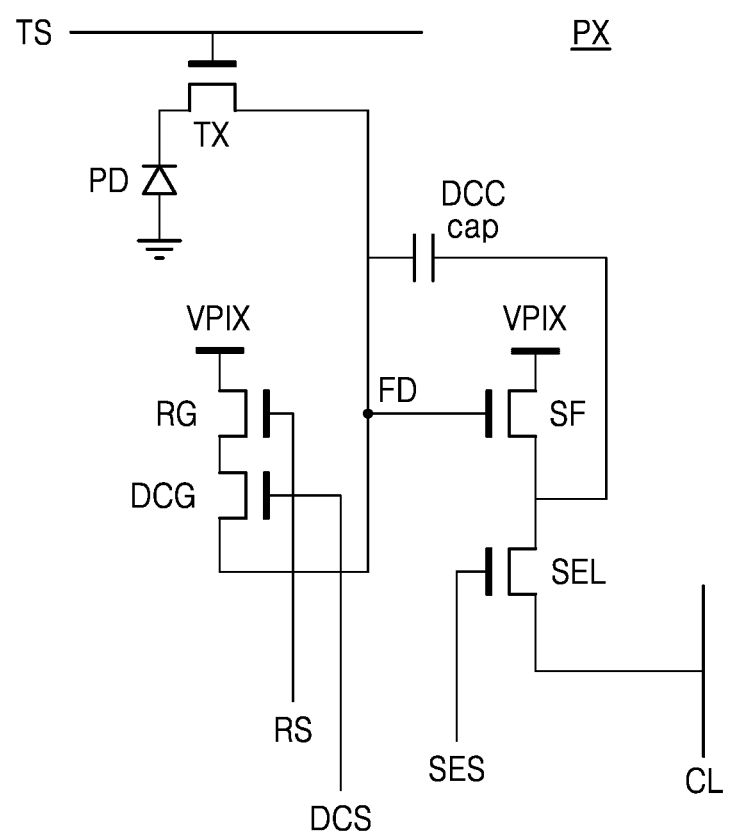
FIG. 2 is a circuit diagram of a pixel of a stacked image sensor according to some embodiments of the inventive concept.

FIG. 2 is a circuit diagram of a pixel of an image sensor according to some embodiments of the inventive concept.

Referring to FIG. 2, the pixel PX may include a photodiode PD. The pixel PX may include a plurality of transistors, for example, a transfer transistor TX, a DCG transistor DCG, a reset transistor RG, a source follower transistor SF, a selection transistor SEL, and a deep contact capacitor DCC cap. Control signals TS, RS, DCS, and SES may be applied to the pixel PX, and at least some of the control signals may be generated by the row driver 120.

The photodiode PD may generate photocharges that vary according to the intensity of light. For example, the photodiode PD may generate charge, that is, electrons with negative charge and holes with positive charge in proportion to the amount of incident light.

The pixel PX may include a transfer transistor TX. One end of the transfer transistor TX may be connected to the photodiode PD, and the other end may be connected to the floating diffusion node FD. The transfer transistor TX may be turned on or off in response to the transfer control signal TS received from the row driver 120. Accordingly, the transfer transistor TX may transfer the photocharge generated by the photodiode PD to the floating diffusion node FD. The floating diffusion node FD may accumulate/store photocharge generated by the photodiode PD while the transfer transistor TX is activated.

The pixel PX may include a reset transistor RG. The reset transistor RG may reset charges accumulated/stored in the floating diffusion node FD. One end of the reset transistor RG may be applied with the pixel voltage VPIX (e.g., a power supply voltage), and the other end may be connected to the DCG transistor DCG. In some other embodiments, a voltage other than the pixel voltage VPIX may be applied to one end of the reset transistor RG. The reset transistor RG may be turned on or off in response to the reset control signal RS received from the row driver 120. Accordingly, charges accumulated/stored in the floating diffusion node FD may be discharged to reset the floating diffusion node FD.

The pixel PX may include a DCG transistor DCG. One end of the DCG transistor DCG may be connected to the floating diffusion node FD, and the other end may be connected to the reset transistor RG. The DCG transistor DCG may be turned on or off in response to the DCG signal DCS received from the row driver 120. The DCG transistor DCG may vary the conversion gain in response to the DCG signal DCS received from the row driver 120. According to some embodiments, the DCG transistor DCG may be turned on in the high illumination mode, and the DCG transistor DCG may be turned off in the low illumination mode.

When the reset signal RS and the DCG signal DCS are activated, the reset transistor RG and the DCG transistor DCG are turned on. Accordingly, the pixel voltage VPIX (e.g., a power supply voltage) may be transferred to the floating diffusion node FD. Charges accumulated/stored in the floating diffusion node FD may be drained to the power supply voltage VPIX, and the voltage of the floating diffusion node FD may be reset to the pixel voltage VPIX (e.g., a power supply voltage) level.

The pixel PX may include a source follower transistor SF. One end of the source follower transistor SF may be connected to the selection transistor SEL, and the pixel voltage VPIX may be applied to the other end. A floating diffusion node FD may be connected to a gate terminal of the source follower transistor SF. The source follower transistor SF may serve as a source follower amplifier for the floating diffusion node FD. The source follower transistor SF may amplify a change in the electrical potential of the floating diffusion node FD and transmit the amplified change to the column line via the selection transistor SEL. The source follower transistor SF may output a voltage corresponding to the charge accumulated/stored in the floating diffusion nodes FD as a pixel signal.

The pixel PX may include a selection transistor SEL. One end of the selection transistor SEL may be connected to the source follower transistor SF, and the other end may be connected to the column line CL. The selection transistor SEL may be turned on or off in response to the selection signal SES received from the row driver 120. When the selection transistor SEL is turned on in the readout operation, a pixel signal including a reset signal corresponding to a reset operation or an image signal corresponding to a charge accumulation operation may be output to the column line CL.

One terminal of the deep contact capacitor DCC cap may be connected to an output terminal of the transfer transistor TX, and the other terminal may be connected to a source terminal of the source follower transistor SF. The capacitance by the deep contact capacitor DCC cap may be a capacitance generated by a deep contact region for connecting the transfer transistor TX to the source follower transistor SF when the transfer transistor TX and the source follower transistor SF are formed on different layers (e.g., different layers spaced apart from each other in the vertical direction). According to some embodiments, the conversion gain may decrease when the capacitance of the floating diffusion node FD increases, and the conversion gain may increase when the capacitance of the floating diffusion node FD decreases. The capacitance of the floating diffusion node FD may be reduced by connecting the other terminal of the deep contact capacitor DCC cap to the source of the source follower transistor SF.

Figure 3:
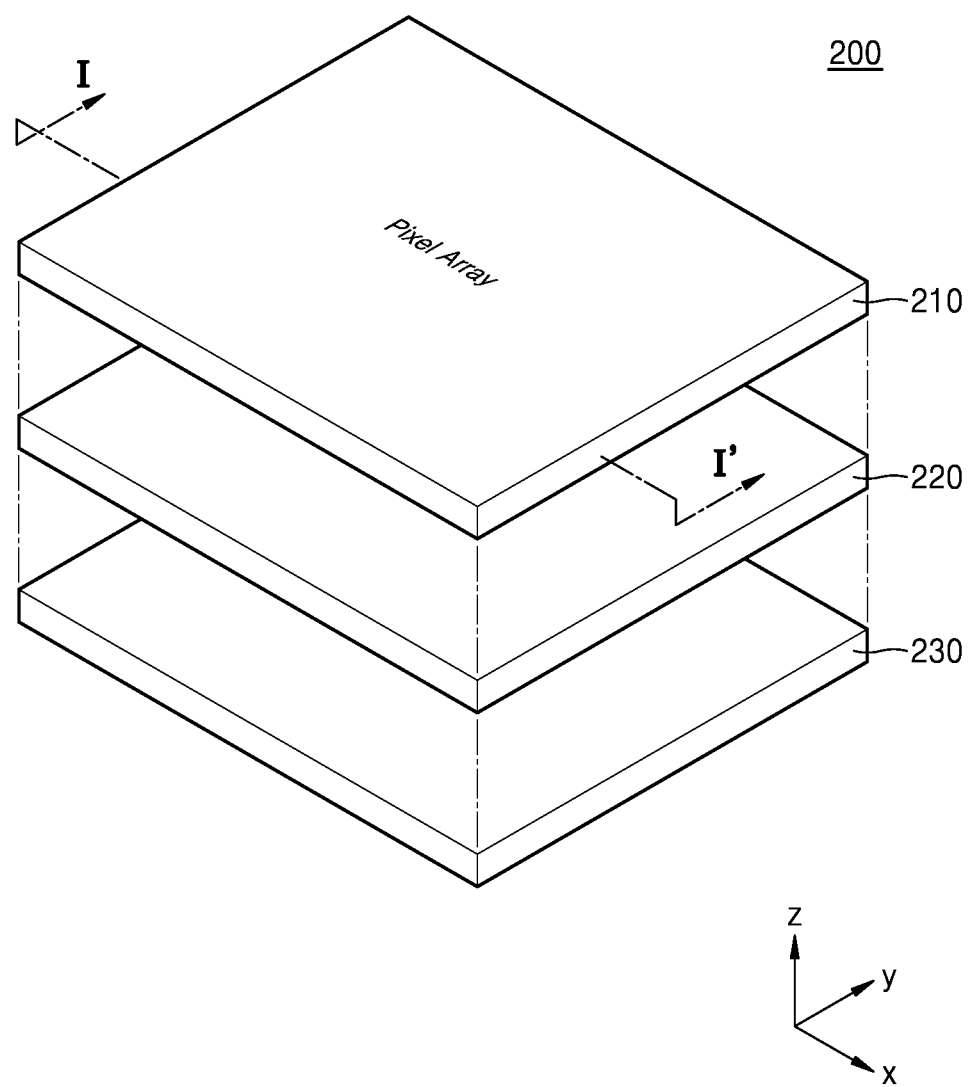
FIG. 3 is a perspective view of stacked image sensor according to some embodiments of the inventive concept.

FIG. 3 is a perspective view of an image sensor according to some embodiments of the inventive concept.

FIG. 3 shows a stacked image sensor 200 according to some embodiments of the inventive concept and is an exploded perspective view showing a first semiconductor chip 210, a second semiconductor chip 220, and a third semiconductor chip 230 separated. The image sensor 200 may include a first semiconductor chip 210, a second semiconductor chip 220, and a third semiconductor chip 230. The image sensor 200 may have a three-dimensional structure formed by bonding three semiconductor chips 210, 220, and 230 together. In some embodiments, the first semiconductor chip 210, the second semiconductor chip 220, and the third semiconductor chip 230 may be sequentially stacked.

The first semiconductor chip 210 may include a plurality of pixels that output signal charge while performing photoelectric conversion. A plurality of pixels may be arranged in a matrix form in a first semiconductor substrate (e.g., a first semiconductor substrate 211 in FIG. 4) of the first semiconductor chip 210. In some embodiments, the first semiconductor chip 210 may include a part of a pixel circuit included in a pixel array.

Although not shown in FIG. 3, color filters and micro lenses may be formed on the upper side of the first semiconductor substrate included in the first semiconductor chip 210. A structure in which color filters and micro lenses are formed on the opposite side of a first insulating layer (e.g., a first insulating layer 214 in FIG. 4) relative to the first semiconductor substrate on which the pixels are formed is referred to as a Back Side Illumination (BSI) structure. In contrast, a structure in which the color filters and micro lenses are formed on the same side of the first insulating layer relative to the first semiconductor substrate, that is, a structure in which color filters and micro lenses are formed on the first insulating layer, is referred to as a front side illumination (FSI) structure.

The second semiconductor chip 220 may include a signal processing circuit capable of outputting pixel signals from the plurality of pixels. In some embodiments, the signal processing circuit may output a pixel signal based on a signal charge output from the pixel signal. In some embodiments, the signal processing circuit may include a readout circuit. In some embodiments, the signal processing circuit may include the remaining part of the pixel circuit included in the pixel array.

The third semiconductor chip 230 may include a logic element that processes a pixel signal output by the second semiconductor chip 220. In some embodiments, the logic element may include the processor 1200 of FIG. 1.

However, this is just an example, and elements or circuits that may be included in the second semiconductor chip 220 and the third semiconductor chip 230 may be changed.

Figure 4:
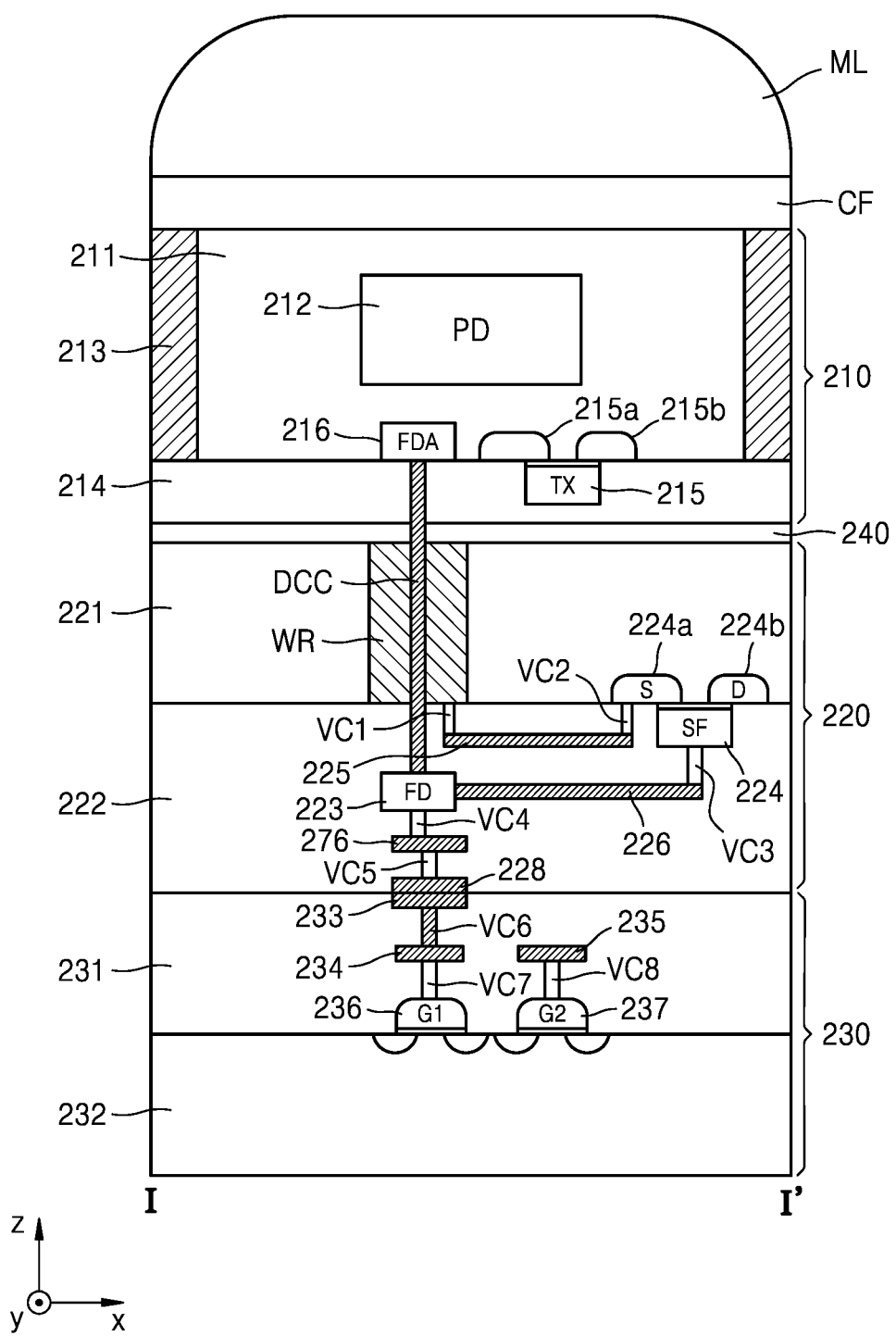
FIG. 4 is a cross-sectional view of a stacked image sensor according to some embodiments of the inventive concept.

FIG. 4 is a cross-sectional view of an image sensor according to some embodiments of the inventive concept. FIG. 4 is a cross-sectional view of the image sensor of FIG. 3 taken along the line I-I' according to some embodiments of the inventive concept.

Referring to FIG. 4, a cross-sectional view of the image sensor 200 in which a first semiconductor chip 210, a second semiconductor chip 220, and a third semiconductor chip 230 are sequentially stacked is disclosed.

The first semiconductor chip 210 may include a first semiconductor substrate 211 and a first insulating layer 214 disposed under the first semiconductor substrate 211. The second semiconductor chip 220 may include a second semiconductor substrate 221 and a second insulating layer 222 disposed under the second semiconductor substrate 221. The third semiconductor chip 230 may include a third semiconductor substrate 232 and a third insulating layer 231 disposed on the third semiconductor substrate 232. An interlayer insulating film 240 may be disposed between the first semiconductor chip 210 and the second semiconductor chip 220. In some embodiments, the first semiconductor substrate 211, the second semiconductor substrate 221, and the third semiconductor substrate 232 may be substrates including a semiconductor such as silicon. In some embodiments, the first semiconductor substrate 211, the second semiconductor substrate 221, and the third semiconductor substrate 232 may be, for example, a silicon single crystal substrate or a silicon on insulator (SOI) substrate. In some embodiments, the first insulating layer 214, the second insulating layer 222, the third insulating layer 231, and the interlayer insulating film 240 may have, for example, a single layer structure or a multilayer structure of at least one of a silicon oxide film, a silicon oxynitride film, a silicon nitride film, and a porous insulating film.

Referring to FIG. 4, a color filter CF and a micro lens ML may be disposed on the first semiconductor substrate 211. The first semiconductor substrate 211 may include a photoelectric conversion region 212 corresponding to a photodiode. The first semiconductor substrate 211 may include a DTI structure 213 that may be separated from other pixel areas.

A first insulating layer 214 may be disposed under the first semiconductor substrate 211. The first insulating layer 214 may include a transfer transistor 215. A gate of the transfer transistor 215 may be formed on the first insulating layer 214. Active regions 215a and 215b of the transfer transistor 215 may be formed on the first semiconductor substrate 211. The first semiconductor substrate 211 may include a floating diffusion area 216 that stores charges transferred from the photoelectric conversion region 212. As used herein, "a layer X includes an element Y" (or similar language) may mean that at least a portion of the element Y is in the layer X.

Referring briefly to the circuit diagram of FIG. 2, the transfer transistor 215 is required to transfer the charge generated from the photoelectric conversion region 212 to the floating diffusion node FD, and the floating diffusion node FD is connected to the gate of the source follower transistor SF. In the image sensor 200 according to some embodiments, the floating diffusion area FDA storing electric charge generated from the photoelectric conversion region 212 may be formed on the first semiconductor substrate 211, and to connect the floating diffusion area FDA with the gate of the source follower transistor SF, a metal pad corresponding to the floating diffusion node FD 223 may be included in the second semiconductor chip 220.

In cross-sectional views, a metal pad corresponding to the floating diffusion node FD of FIG. 2 may be indicated by a symbol of FD. Hereinafter, when describing cross-sectional views, a "metal pad corresponding to a floating diffusion node" may be used interchangeably with a "floating diffusion node FD".

Referring back to FIG. 4, the floating diffusion node 223 may be included in the second semiconductor chip 220. The image sensor 200 may further include a deep contact DCC for connecting the floating diffusion node 223 to the floating diffusion area FDA located on different layers. In some embodiments, the deep contact DCC may electrically connect the floating diffusion node 223 and the floating diffusion area FDA, which are provided in different layers spaced apart from each other in a vertical direction (e.g., a Z-axis direction).

Referring to FIG. 4, the deep contact DCC may be a vertical contact extending vertically from the floating diffusion area FDA in the third direction, that is, in the Z-axis direction. The deep contact DCC may be in (e.g., may pass through) the first insulating layer 214, the interlayer insulating film 240, the second semiconductor substrate 221, and the second insulating layer 222.

The second semiconductor substrate 221 may further include a well region WR surrounding the deep contact DCC. In some embodiments, the well region WR may be a region doped with impurities different from impurities in the second semiconductor substrate 221. The impurities included in the well region WR may have a different conductivity type from that of the second semiconductor substrate 221. In some embodiments, the well region WR may be a region doped with n-type impurities. The second semiconductor substrate 221 may be a region doped with p-type impurities. According to some other embodiments, the well region WR may be a region having a conductive material. In some embodiments, the well region WR may be provided with a material electrically connected to the source of the source follower transistor SF. As used herein, "a layer X doped with impurities Y" (or similar language) means that the layer X includes impurities Y. Further, as used herein, "a region X surrounding an element Y" (or similar language) means that at least a portion of the element Y is in the region X.

The second insulating layer 222 may include a source follower transistor 224 and a floating diffusion node FD. In some embodiments, the gate of the source follower transistor 224 may be formed on the second insulating layer 222, and the active regions 224a and 224b of the source follower transistor 224 may be formed on the second semiconductor substrate 221. In some embodiments, the source region 224a of the source follower transistor 224 may be electrically connected to the well region WR surrounding the deep contact DCC.

Referring to FIG. 4, the second insulating layer 222 may further include a first vertical contact VC1 extending vertically from the well region WR, a second vertical contact VC2 extending vertically from the source region 224a of the source follower transistor 224, and a metal pad 225 connecting the first vertical contact VC1 to the second vertical contact VC2 in the first direction, that is, in the X-axis direction.

The floating diffusion node 223 may be electrically connected to the gate of the source follower transistor 224 through the third vertical contact VC3 and the metal pad 226.

The second insulating layer 222 may include additional metal pads 276 and 228 and additional vertical contacts VC4 and VC5. The additional vertical contacts VC4 and VC5 may electrically connect the additional metal pads 276 and 228 each other. Vertical contacts at different locations may be vertically connected via metal pads.

The third semiconductor chip 230 may include a third semiconductor substrate 232 and a third insulating layer 231. The second insulating layer 222 and the third insulating layer 231 may be electrically connected through metal bonding. The metal pads 228 and 233 respectively included in the second insulating layer 222 and the third insulating layer 231 may be electrically connected by bonding the metal pads 228 and 233. The third insulating layer 231 may include metal pads 234 and 235 and vertical contacts VC6, VC7 and VC8, and may include a plurality of transistors 236 and 237.

FIG. 4 illustrates a structure in which the transfer transistor TX of the pixel PX is included in the first semiconductor chip 210, and the second semiconductor chip 220 includes the source follower transistor SF of the pixel PX and the metal pad of the floating diffusion node FD as an example. For convenience of explanation, transistors other than the source follower transistor SF and the floating diffusion node FD of the pixel PX are omitted from the drawing. In some embodiments, the remaining transistors included in the pixel PX, such as the selection transistor SEL, the reset transistor RG, and the DCG transistor DCG, may be included in the second semiconductor chip 220. In some embodiments, the readout circuit illustrated in FIG. 1 may be included in the second semiconductor chip 220 or the third semiconductor chip 230. In some embodiments, a circuit related to the processor 1200 illustrated in FIG. 1 may be included in the third semiconductor chip 230.

Figure 5:
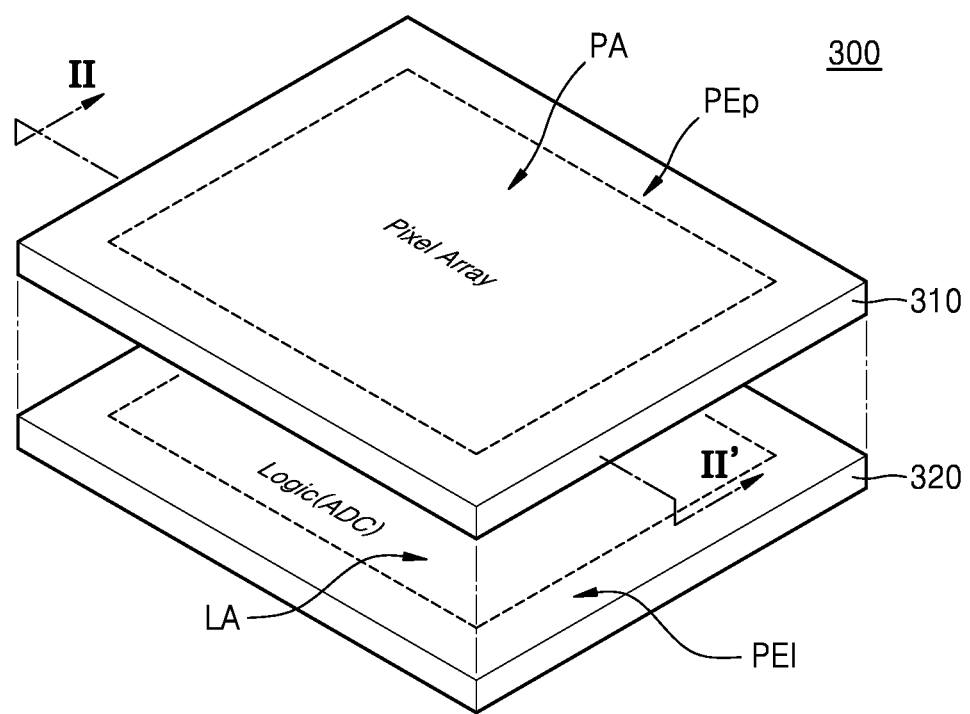
FIG. 5 is a perspective view of stacked image sensor according to some embodiments of the inventive concept.

FIG. 5 is a perspective view of an image sensor according to some embodiments of the inventive concept.

FIG. 5 shows a stacked complementary metal-oxide-semiconductor (CMOS) image sensor 300 according to some embodiments of the inventive concept and is an exploded perspective view showing a first semiconductor chip 310 on which pixels are disposed and a second semiconductor chip 320 on which logic elements are disposed. The stacked image sensor 300 includes the first semiconductor chip 310 and the second semiconductor chip 320 and may have a structure in which the first semiconductor chip 310 is stacked on the second semiconductor chip 320.

The first semiconductor chip 310 may include a pixel area PA and a pixel peripheral area PEp. The pixel area PA is disposed in the central region of the first semiconductor chip 310, and a plurality of pixels may be disposed in a two-dimensional array structure. The pixel peripheral area PEp may have a structure surrounding the pixel area PA and may be disposed outside the pixel area PA, and wires for electrical connection with the second semiconductor chip 320 may be disposed in the pixel peripheral area PEp.

In a cross-sectional view, a first semiconductor substrate (e.g., a first semiconductor substrate 311 in FIG. 6) may be positioned on the upper side of the first semiconductor chip 310 and a first insulating layer (e.g., a first insulating layer 314) may be positioned on the lower side of the first semiconductor chip 310. Pixels may be formed on the first semiconductor substrate.

Meanwhile, in the structure of the stacked image sensor 300 of FIG. 5, the pixel peripheral areas PEp are disposed on all four surfaces of the first semiconductor chip 310, and the structure of the pixel peripheral areas PEp is not limited thereto. For example, the pixel peripheral area PEp may not be formed on at least one of the four surfaces of the first semiconductor chip 310.

The second semiconductor chip 320 may include a logic area LA and a logic peripheral area PE1. The logic area LA may be disposed in the central area of the second semiconductor chip 320, and a plurality of logic elements may be disposed in the logic area LA. The logic elements may include various circuits for processing pixel signals from pixels of the first semiconductor chip 310. For example, the logic elements may include an analog signal processing circuit, an analog-to-digital converter (ADC) circuit, an image signal processing circuit, and a control circuit. The circuits included in the logic elements are not limited to the circuits listed herein. The logic peripheral area PE1 may have a structure surrounding the logic area LA and may be placed outside the logic area LA and wires for electrical connection with the first semiconductor chip 310 may be disposed in the logic peripheral area PE1. The logic peripheral area PE1 is also disposed on all four surfaces of the second semiconductor chip 320, but is not limited thereto, and the logic peripheral area PE1 may not be formed on at least one of the four surfaces of the second semiconductor chip 320.

Figure 6:
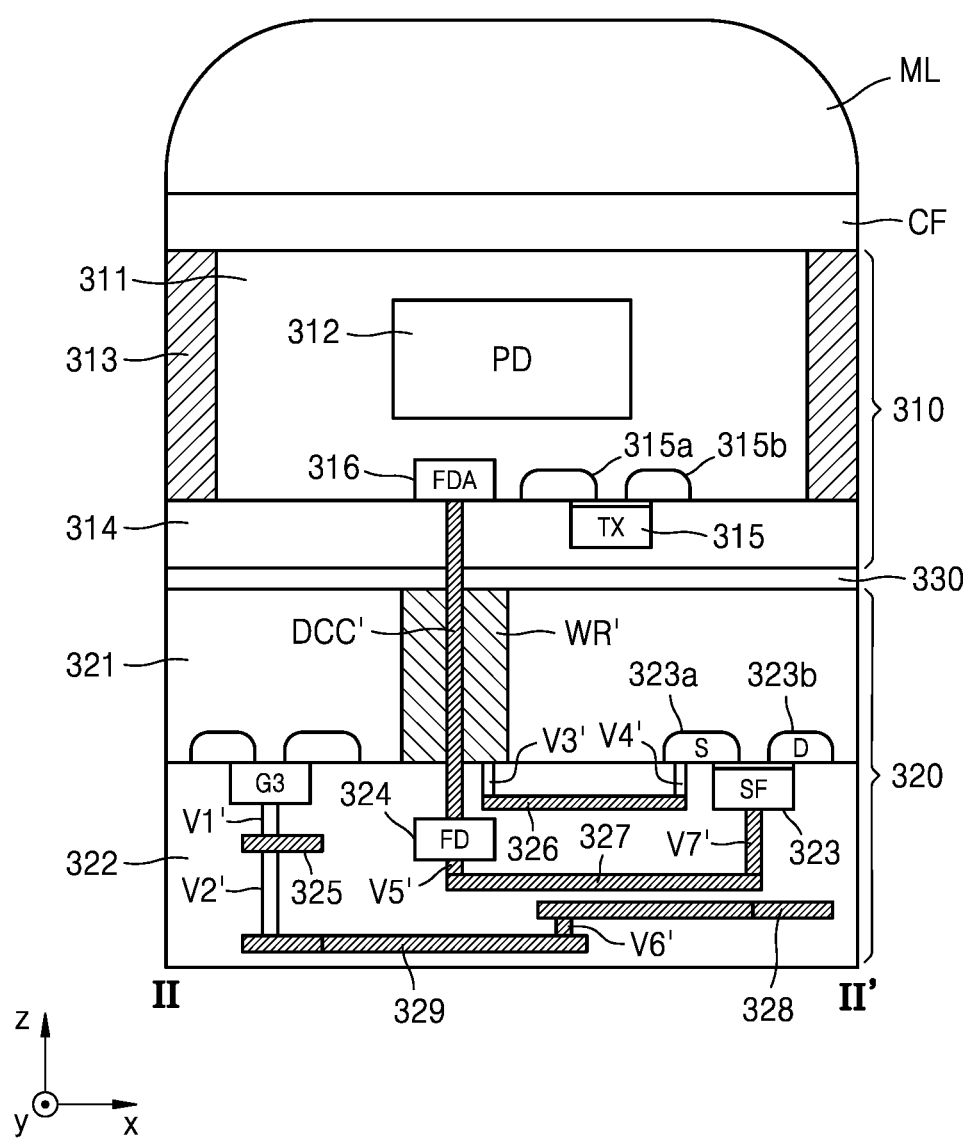
FIG. 6 is a cross-sectional view of a stacked image sensor according to some embodiments of the inventive concept.

FIG. 6 is a cross-sectional view of an image sensor according to some embodiments of the inventive concept. FIG. 6 is a cross-sectional view of the image sensor of FIG. 5 taken along the line II-II' according to some embodiments of the inventive concept.

Referring to FIG. 6, a cross-sectional view of the image sensor 300 in which a first semiconductor chip 310 and a second semiconductor chip 320 are sequentially stacked is disclosed. The first semiconductor chip 310 may include a first semiconductor substrate 311 and a first insulating layer 314 disposed under the first semiconductor substrate 311. The second semiconductor chip 320 may include a second semiconductor substrate 321 and a second insulating layer 322 disposed under the second semiconductor substrate 321. An interlayer insulating film 330 may be disposed between the first semiconductor chip 310 and the second semiconductor chip 320.

Referring to FIG. 6, a color filter CF and a micro lens ML may be disposed on the first semiconductor substrate 311. The first semiconductor substrate 311 may include a photoelectric conversion region 312 corresponding to a photodiode. The first semiconductor substrate 311 may include a DTI structure 313 that may be separated from other pixel areas.

A first insulating layer 314 may be disposed under the first semiconductor substrate 311. The first insulating layer 314 may include a transfer transistor 315. A gate of the transfer transistor 315 may be formed on the first insulating layer 314. Active regions 315a and 315b of the transfer transistor 315 may be formed on the first semiconductor substrate 311. The first semiconductor substrate 311 may include a floating diffusion area 316.

Referring to FIG. 6, the floating diffusion area 316 is required to be connected to the gate of the source follower transistor 323. To this end, the floating diffusion area 316 may be connected to a deep contact DCC' penetrating the first insulating layer 314, the interlayer insulating film 330, the second semiconductor substrate 321, and the second insulating layer 322.

The deep contact DCC' may be a vertical contact penetrating the first insulating layer 314, the interlayer insulating film 330, the second semiconductor substrate 321, and the second insulating layer 322. The deep contact DCC' may be a vertical contact connecting the floating diffusion area 316 located on the first semiconductor substrate 311 to the floating diffusion node 324 located on the second insulating layer 322. The floating diffusion node 324 may be a metal pad of a floating diffusion node FD disposed on the second insulating layer 322 provided to be connected to the floating diffusion area 316 formed on the first semiconductor chip 310. In some embodiments, the deep contact DCC' may have a structure surrounded by the well region WR'. The well region WR' may be a structure included in the second semiconductor substrate 321. The well region WR' may be provided at the same height as the second semiconductor substrate 321. In some embodiments, lower surfaces of the well region WR' and the second semiconductor substrate 321, which face the second insulating layer 322, may be coplanar with each other, as illustrated in FIG. 6. Further, in some embodiments, the well region WR' and the second semiconductor substrate 321 may have an equal thickness in the vertical direction (e.g., the Z-axis direction), as illustrated in FIG. 6. Since the characteristics of the well region WR' are the same as those of the well region WR shown in FIG. 4, description thereof is omitted.

The second insulating layer 322 may include logic elements and some transistors of a pixel circuit. In FIG. 6, only the source follower transistor 323 and the additional transistor G3 are shown for convenience of description.

Referring to FIG. 6, active regions 323a and 323b of the source follower transistor 323 may be formed on the second semiconductor substrate 321. The source region 323a of the source follower transistor 323 may be electrically connected to the well region WR'. The source region 323a of the source follower transistor 323 may be electrically connected to the well region WR' through the first vertical contact V3', the second vertical contact V4', and the metal pad 326.

A gate of the source follower transistor 323 may be electrically connected to the floating diffusion node 324. A gate of the source follower transistor 323 may be connected to the floating diffusion node 324 through vertical contacts V5' and V7' and the metal pad 327.

In addition, the second insulating layer 322 may include an additional transistor G3, a plurality of vertical contacts V1', V2', and V6', and a plurality of metal pads 326, 328, and 329.

An example of a 3-stack stacked image sensor is described in FIGS. 3 and 4, and an example of a 2-stack stacked image sensor is described in FIGS. 5 and 6. However, this is only an example and the stacked image sensor according to the inventive concept may not be limited to those shown in FIGS. 3 to 6. It should be noted that in the cross-sectional views of FIGS. 4 and 6, some components included in each semiconductor chip of the stacked image sensor are omitted.

Figure 7A:
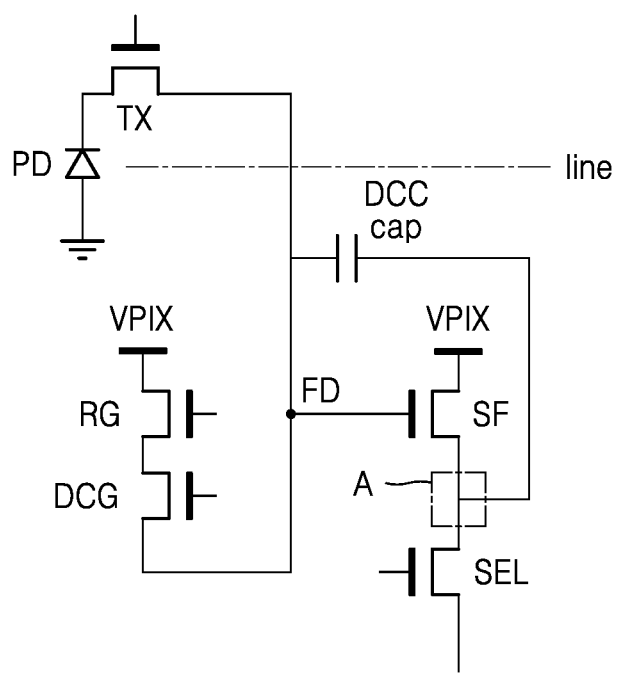
FIGS. 7A, 7B, and 7C are a circuit diagram of a pixel and cross-sectional and perspective views corresponding thereto, respectively, according to some embodiments of the inventive concept.
Figure 7B:
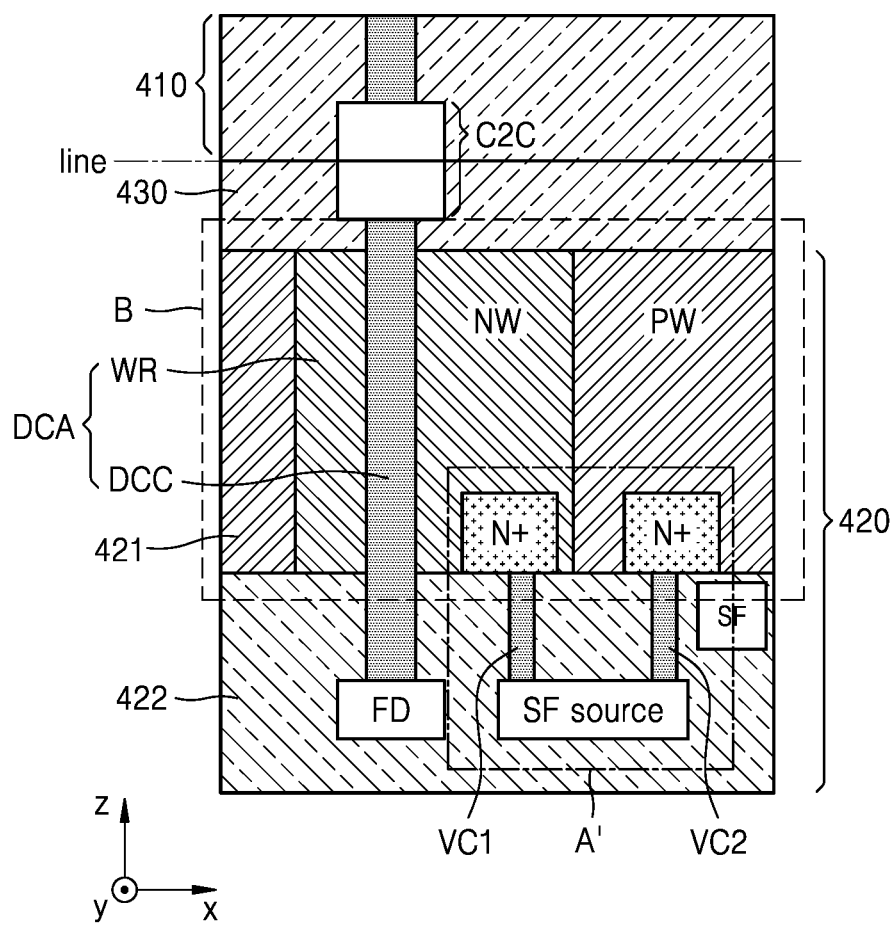
Figure 7C:
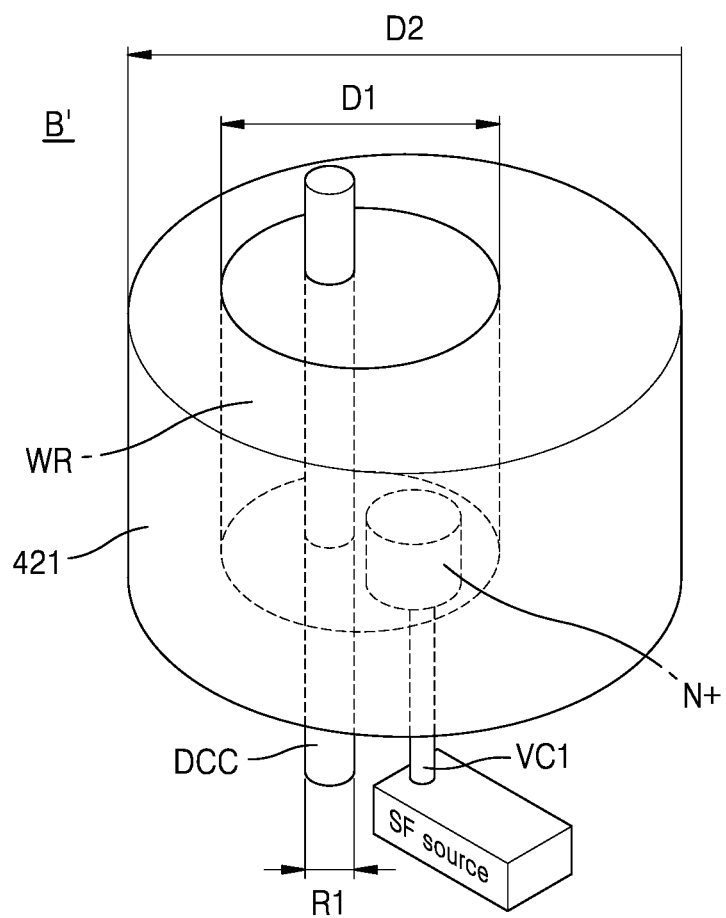

FIGS. 7A, 7B, and 7C are diagrams for explaining a circuit diagram of a pixel and cross-sectional and perspective views corresponding thereto, respectively, according to some embodiments of the inventive concept.

Referring to FIG. 7A, a circuit diagram of a pixel according to some embodiments of the inventive concept is shown. In FIG. 7A, descriptions overlapping those described in FIG. 2 are omitted.

Referring to FIG. 7A, a photodiode PD and a transfer transistor TX included in a pixel may be disposed in a first area. The first area may refer to an area above the line. Referring to FIG. 7A, a DCG transistor DCG, a reset transistor RG, a source follower transistor SF, and a selection transistor SEL included in a pixel may be disposed in a second area. The second area may refer to an area below the line. In some embodiments, the first area and the second area may be different chip areas. In some embodiments, the first area may correspond to the first semiconductor chip. In some embodiments, the second area may correspond to the second semiconductor chip. In FIG. 7A, a portion where the deep contact capacitor DCC cap is connected to the source region of the source follower transistor SF is indicated as A. A', which is a cross-sectional view corresponding to the portion A, is shown in FIG. 7B.

Referring to FIG. 7B, a cross-sectional view corresponding to the circuit diagram shown in FIG. 7A is shown.

Based on the lines shown in FIGS. 7A and 7B, the upper area may be the first area and the lower area may be the second area.

In some embodiments, an interlayer insulating film 430 may be disposed between the first area 410 and the second area 420. As shown, a lower portion of the first area 410 corresponds to an insulating layer, and an upper portion of the second area 420 may be a semiconductor substrate (e.g., a second semiconductor substrate 421). A lower portion of the second area 420 may be an insulating layer 422. To easily connect the first area 410 and the second area 420 (e.g., elements included in the first area 410 and the second area 420) to each other, an interlayer insulating film 430 may be disposed between the first area 410 and the second area 420. The first area 410 and the interlayer insulating film 430 may be formed through metal-to-metal bonding C2C. Here, the metal may be, for example, copper (Cu). However, the metal is not limited to Cu. Through this, the first area 410 and the second area 420 (e.g., elements included in the first area 410 and the second area 420) may be electrically connected to each other. Through this, the floating diffusion area (not shown) in the first area 410 may be connected to the metal pad of the floating diffusion node FD in the second area 420. The floating diffusion area may be connected to the metal pad through a deep contact ECC extending vertically.

In some embodiments, the deep contact capacitor DCC cap of FIG. 7A may be a capacitor formed by the vertically extending deep contact DCC and the well region WR surrounding the deep contact DCC of FIG. 7B. In some embodiments, the deep contact area DCA may be a concept including a deep contact DCC and a well region WR.

Referring to part A' of FIG. 7B, an example in which the source SF source of the source follower transistor SF is connected to the well region WR of the deep contact region DCA is shown. In some embodiments, the source SF source of the source follower transistor SF may be connected to the well region WR through the vertical contact VC1.

As illustrated in FIG. 7B, in some embodiments, an additional doped region N+ connected to the source SF source of the source follower transistor SF may be included in the well region WR. In some embodiments, lower surfaces of the well region WR and the second semiconductor substrate 421, which face the insulating layer 422, may be coplanar with each other, as illustrated in FIG. 7B. Further, in some embodiments, the well region WR and the second semiconductor substrate 421 may have an equal thickness in the vertical direction (e.g., the Z-axis direction), as illustrated in FIG. 7B.

FIG. 7C is a perspective view B' corresponding to the cross-sectional view of part B of FIG. 7B.

Referring to FIG. 7C, a cylindrical deep contact DCC, a cylindrical well region WR surrounding the deep contact DCC, and a second semiconductor substrate 421 surrounding the well region WR are shown. In some embodiments, the diameter of the deep contact DCC may be R1. The diameter of the well region WR may be D1. The diameter of the second semiconductor substrate 421 may be D2. In some embodiments, the condition of R1<D1<D2 may be satisfied. The well region WR may further include an n+ doped region connected to the source of the source follower transistor.

In some embodiments, the entire well region WR may be an n-type impurity region. In some other embodiments, only a portion of the well region WR connected to the source SF source of the source follower transistor may be doped with n-type impurities.

In some embodiments, the well region WR and the second semiconductor substrate 421 may have the same height. In some embodiments, the well region WR may be provided to cover all contact surfaces of the deep contact DCC in the second semiconductor substrate 421. In some embodiments, the deep contact DCC includes a portion of a side surface facing the second semiconductor substrate 421, and the well region WR may cover an entirety of that portion of the side surface of the deep contact DCC, as illustrated in FIG. 7C.

Figure 8A:
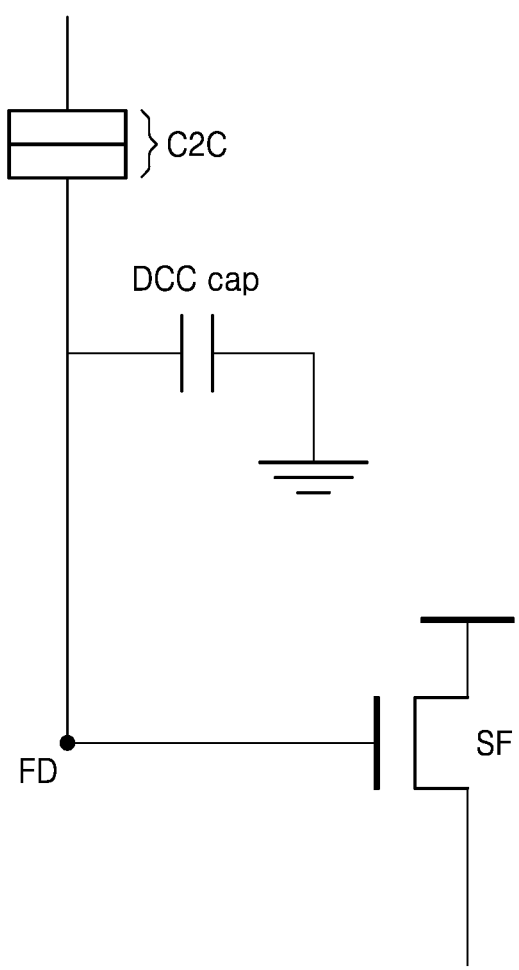
FIGS. 8A and 8B are circuit diagrams of a conventional pixel and a pixel according to some embodiments of the inventive concept.
Figure 8B:
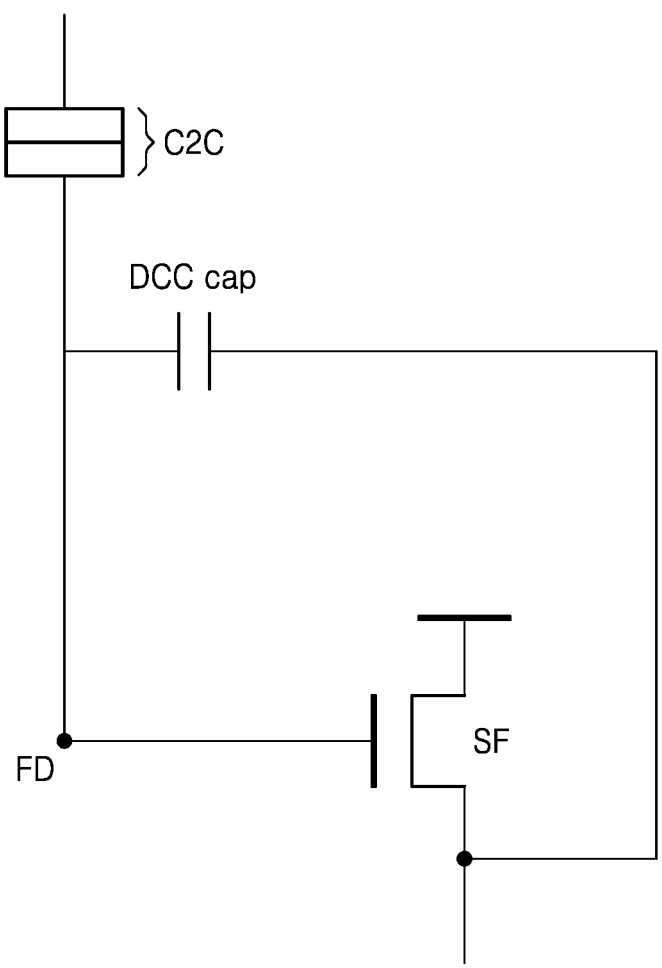

FIGS. 8A and 8B are diagrams for comparing circuit diagrams of a conventional pixel and a pixel according to some embodiments of the inventive concept.

FIG. 8A may be a portion of a circuit diagram of a conventional pixel. Referring to FIG. 8A, a circuit diagram of a floating diffusion node FD and a source follower transistor SF located under the metal bonding C2C is shown. The floating diffusion node FD may have a high capacitance due to a deep contact capacitor DCC cap by a deep contact. According to the conventional pixel, a deep contact capacitor DCC cap due to deep contact may be adjacent to a p-type well region. In this case, even if the voltage of the floating diffusion node FD changes, the voltage applied to the source follower transistor by the adjacent P-type well region may be fixed. Also, the capacitance may be still high and that may adversely affect the conversion gain.

FIG. 8B may be a portion of a circuit diagram of a pixel according to some embodiments of the inventive concept. Referring to FIG. 8B, the deep contact capacitor DCC cap connected to the floating diffusion node FD may be connected to the source of the source follower transistor SF. In some embodiments, an n-type well region surrounding the deep contact capacitor DCC cap may be connected to the source of the source follower transistor SF. According to the inventive concept, when the voltage of the floating diffusion node FD is changed, the voltage may be changed by the n-type well surrounding the deep contact, and as a result, the gain of the source follower is reduced, and thus the capacitance may be reduced.

According to some embodiments of the inventive concept, in a stacked CMOS image sensor, a conversion gain may be improved by reducing capacitance of a deep contact. In some embodiments, the stacked CMOS image sensor may have a 3-stack structure. In some other embodiments, the stacked CMOS image sensor may have a 2-stack structure.

According to some embodiments of the inventive concept, a region (e.g., a well region) of a substrate (e.g., a portion of a silicon layer) around a deep contact may be electrically connected to a source of a source follower transistor. According to some embodiments of the inventive concept, after forming that region (e.g., the portion of the silicon layer) surrounding a deep contact, which may have a first conductivity type, that region having the first conductivity type may be connected to the source of the source follower transistor. In some embodiments, the first conductivity type may be n-type. Through this, the Miller effect may occur, and the deep contact capacitance may be reduced by 90%.

Although terms (e.g., first, second or third) may be used herein to describe various elements, these elements should not be limited by these terms. These terms are only used to distinguish one element from another. For example, a first element may be referred to as a second element, and, similarly a second element may be referred to as a first element without departing from the teachings of the disclosure.

As used herein, an element or region that is "covering" or "surrounding" another element or region may completely or partially cover or surround the other element or region. As used herein, "an element A connected to an element B" (or similar language) may mean that the element A is electrically connected to the element B and/or the element A contacts the element B.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

While the inventive concept has been particularly shown and described with reference to some example embodiments thereof, it will be understood that various changes in form and details may be made therein without departing from the scope of the following claims. Accordingly, the above-disclosed subject matter is to be considered illustrative, and not restrictive, and the appended claims are intended to cover all such modifications, enhancements, and other embodiments, which fall within the scope of the inventive concept.

What is claimed is:

1. A stacked image sensor comprising:
   a first semiconductor substrate including a photoelectric conversion region and a floating diffusion area configured to store charges transferred from the photoelectric conversion region;
   a color filter and a micro lens on the first semiconductor substrate;
   a first insulating layer under the first semiconductor substrate;
   a transfer transistor configured to transfer charges from the photoelectric conversion region, wherein a gate of the transfer transistor is in the first insulating layer;
   a second semiconductor substrate under the first insulating layer and including first impurities of a first conductivity type, wherein the second semiconductor substrate includes a well region;
   a second insulating layer under the second semiconductor substrate;
   a metal pad of a floating diffusion node and a gate of a source follower transistor in the second insulating layer; and
   a deep contact that is in the first insulating layer and the second semiconductor substrate and electrically connects the floating diffusion area to the metal pad of the floating diffusion node,
   wherein at least a portion of the deep contact is in the well region.

2. The stacked image sensor of claim 1, wherein the well region includes second impurities of a second conductivity type.

3. The stacked image sensor of claim 2, wherein the second conductivity type is an N-type.

4. The stacked image sensor of claim 1, wherein the well region is electrically connected to a source region of the source follower transistor, and the gate of the source follower transistor is electrically connected to the floating diffusion node.

5. The stacked image sensor of claim 4, wherein the well region and the source region of the source follower transistor are spaced apart from each other in a horizontal direction, and
   the stacked image sensor further comprising:
   a first vertical contact connected to the well region;
   a second vertical contact connected to the source region of the source follower transistor; and
   a metal pad connecting the first vertical contact and the second vertical contact to each other.

6. The stacked image sensor of claim 1, wherein the well region includes a conductive material.

7. A stacked image sensor comprising:
   a first semiconductor chip including a two-dimensionally arranged plurality of pixels in an upper region of the first semiconductor chip and a first insulating layer in a lower region of the first semiconductor chip;
   a second semiconductor chip including at least one transistor configured to output a pixel signal of the plurality of pixels and a second insulating layer in a lower region of the second semiconductor chip, wherein the second semiconductor chip includes a well region that includes first impurities and is electrically connected to a source region of the at least one transistor; and
   a third semiconductor chip including a circuit configured to process the pixel signal,
   wherein the first semiconductor chip and the second semiconductor chip are electrically connected to each other through a deep contact extending in a vertical direction, and
   wherein at least a portion of the deep contact is in the well region.

8. The stacked image sensor of claim 7, wherein the second semiconductor chip further comprises a second substrate including second impurities, and the well region is in the second substrate, and
   wherein the well region and the second substrate have an equal thickness in the vertical direction.

9. The stacked image sensor of claim 7, wherein the well region is electrically connected to a source region of a source follower transistor.

10. The stacked image sensor of claim 8, wherein the first impurities are N-type impurities, and the second impurities are P-type impurities.

11. A stacked image sensor comprising:
    a pixel array including a plurality of pixels;
    a row driver configured to transmit a boosting signal to the pixel array; and
    a readout circuit configured to read out pixel signals output from the plurality of pixels of a row selected by the row driver,
    wherein each of the plurality of pixels comprises:
    a photodiode;
    a transfer transistor electrically connected to the photodiode;
    a floating diffusion node configured to store charges generated by the photodiode;
    a deep contact capacitor connected to an output terminal of the transfer transistor; and
    a source follower transistor including one end electrically connected to a pixel voltage, a gate electrically connected to the floating diffusion node, and a source electrically connected to the deep contact capacitor.

12. The stacked image sensor of claim 11, wherein the transfer transistor is in a first area of the stacked image sensor,
    wherein the source follower transistor is in a second area of the stacked image sensor, and
    wherein the first area is above the second area.

13. The stacked image sensor of claim 12, wherein a floating diffusion area configured to store charges from the photodiode is in the first area, and a metal pad of the floating diffusion node electrically connected to the floating diffusion area is in the second area.

14. The stacked image sensor of claim 13, wherein the first and second areas are stacked in a vertical direction, and wherein the deep contact capacitor is a capacitor including a deep contact area that extends in the vertical direction and electrically connects the floating diffusion area to the metal pad of the floating diffusion node.

15. The stacked image sensor of claim 14, wherein the deep contact area comprises:
   a deep contact extends in the second area in the vertical direction; and
   a well region, wherein at least a portion of the deep contact is in the well region.

16. The stacked image sensor of claim 15, wherein a source of the source follower transistor is electrically connected to the well region.

17. The stacked image sensor of claim 16, wherein the well region includes first impurities different from second impurities included in the second area.

18. The stacked image sensor of claim 16, wherein the well region includes N-type impurities, and the second area includes P-type impurities.

19. The stacked image sensor of claim 16, wherein the well region includes a conductive material, and the second area including a region that includes P-type impurities.

20. The stacked image sensor of claim 19, wherein the well region and the region of the second area have an equal thickness in the vertical direction.

* * * * *